United States Patent
Mühlbacher-Karrer et al.

(10) Patent No.: US 11,994,441 B2
(45) Date of Patent: May 28, 2024

(54) SENSOR DEVICE FOR ENVIRONMENTAL PERCEPTION AND/OR FOR RELIABLY GRIPPING AND MANIPULATING OBJECTS

(71) Applicants: JOANNEUM RESEARCH Forschungsgesellschaft mbH, Graz (AT); Alpen-Adria-Universität Klagenfurt, Klagenfurt am Wörthersee (AT)

(72) Inventors: Stephan Johann Mühlbacher-Karrer, Klagenfurt (AT); Hubert Zangl, Graz (AT); Herbert Gold, Graz (AT); Georg Jakopic, Graz (AT); Andreas Tschepp, Kumberg (AT)

(73) Assignees: Joanneum Research Forschungsgesellschaft mbH, Graz (AT); Alpen-Adria-Universität Klagenfurt, Klagenfurt am Wörthersee (AT)

( * ) Notice: Subject to any disclaimer, the term of this patent is extended or adjusted under 35 U.S.C. 154(b) by 46 days.

(21) Appl. No.: 17/289,532

(22) PCT Filed: Oct. 29, 2019

(86) PCT No.: PCT/EP2019/079500
§ 371 (c)(1),
(2) Date: Apr. 28, 2021

(87) PCT Pub. No.: WO2020/089211
PCT Pub. Date: May 7, 2020

(65) Prior Publication Data
US 2021/0396612 A1 Dec. 23, 2021

(30) Foreign Application Priority Data
Oct. 29, 2018 (AT) .............................. A 50929/2018

(51) Int. Cl.
*G01L 5/00* (2006.01)
*G01D 5/24* (2006.01)
(Continued)

(52) U.S. Cl.
CPC ............... *G01L 5/009* (2013.01); *G01D 5/24* (2013.01); *G01L 1/16* (2013.01); *H01L 25/16* (2013.01);
(Continued)

(58) Field of Classification Search
CPC .. G01L 5/009; G01L 1/14; G01L 1/16; H10N 39/00; H10N 30/302; H10N 30/878; H10N 30/857; G01D 5/24; H01L 25/16
See application file for complete search history.

(56) References Cited

U.S. PATENT DOCUMENTS

| | | | |
|---|---|---|---|
| 5,539,292 A | 7/1996 | Vranish | |
| 9,612,690 B2 * | 4/2017 | Zirkl | ................... G06F 3/04186 |

(Continued)

FOREIGN PATENT DOCUMENTS

| | | |
|---|---|---|
| CN | 202442824 U | 9/2012 |
| EP | 3007041 A1 | 4/2016 |

(Continued)

OTHER PUBLICATIONS

International Search Report from PCT International Application No. PCT/EP2019/079500, dated Jan. 28, 2020.
(Continued)

*Primary Examiner* — Octavia Davis Hollington
(74) *Attorney, Agent, or Firm* — Budzyn IP Law, LLC

(57) ABSTRACT

A sensor device comprising at least a first substrate, a capacitive sensor for recording the approach of an object, a piezoelectric sensor for recording a pressure, wherein the capacitive sensor is arranged on a first side of the first substrate and the piezoelectric sensor is arranged on a
(Continued)

second side of the first substrate, wherein the second side is opposite the first side, or wherein the capacitive sensor and the piezoelectric sensor are arranged on the same side of the substrate.

16 Claims, 4 Drawing Sheets

(51) Int. Cl.
    *G01L 1/16*     (2006.01)
    *H01L 25/16*     (2023.01)
    *H10N 30/30*     (2023.01)
    *H10N 30/857*     (2023.01)
    *H10N 30/87*     (2023.01)
    *H10N 39/00*     (2023.01)

(52) U.S. Cl.
    CPC ........... *H10N 39/00* (2023.02); *H10N 30/302* (2023.02); *H10N 30/857* (2023.02); *H10N 30/878* (2023.02)

(56) References Cited

U.S. PATENT DOCUMENTS

| | | |
|---|---|---|
| 2001/0024194 A1 | 9/2001 | Shigetaka et al. |
| 2009/0200815 A1 | 8/2009 | Sugahara et al. |
| 2014/0260678 A1 | 9/2014 | Jentoft et al. |
| 2016/0207202 A1 | 7/2016 | Lee et al. |
| 2016/0299625 A1 | 10/2016 | Kano |
| 2016/0320893 A1 | 11/2016 | Mori et al. |
| 2017/0102822 A1* | 4/2017 | Ando ................... H10N 30/302 |
| 2018/0101261 A1 | 4/2018 | Mori et al. |
| 2018/0183438 A1 | 6/2018 | Shigetaka et al. |
| 2018/0242851 A1 | 8/2018 | Van Den Ende et al. |
| 2018/0254405 A1* | 9/2018 | Sprentall .............. H10N 30/079 |

FOREIGN PATENT DOCUMENTS

| | | | |
|---|---|---|---|
| GB | 2544353 A | 5/2017 | |
| JP | 2001243010 A | 9/2001 | |
| JP | 2009192256 A | 8/2009 | |
| JP | 2015155880 A | 8/2015 | |
| JP | 5954500 B2 * | 7/2016 | ........... G06F 3/0414 |
| JP | 2017203691 A | 11/2017 | |
| JP | 2017215960   * | 12/2017 | |
| JP | 2017215960 A | 12/2017 | |
| WO | 2015098725 A1 | 7/2015 | |
| WO | 2015139716 A1 | 9/2015 | |
| WO | WO-2016208560 A1 * | 12/2016 | ............. G06F 3/041 |
| WO | 2017209084 A1 | 7/2017 | |

OTHER PUBLICATIONS

Office Action with Search Report for Austrian Application No. 50929/2018 dated Sep. 11, 2019.

Office Action from Japanese Patent Application No. JP2021/547921 dated Aug. 17, 2023.

Office Action from Japanese Application No. 2021-547921 dated Feb. 16, 2024.

* cited by examiner

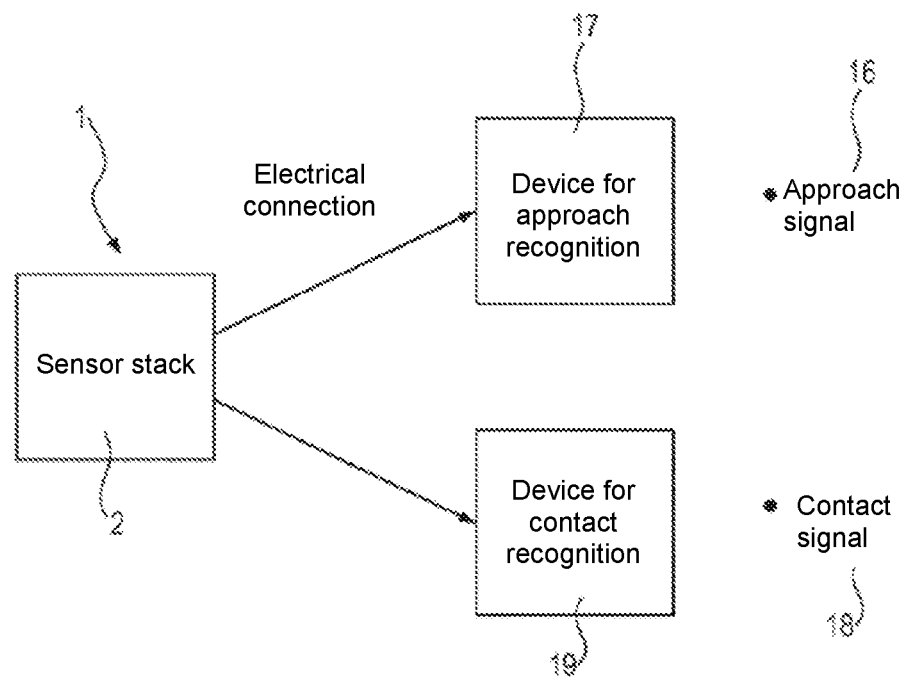

SENSOR DEVICE FOR ENVIRONMENTAL PERCEPTION AND/OR FOR RELIABLY GRIPPING AND MANIPULATING OBJECTS

FIELD OF THE INVENTION

The invention relates to a sensor device.

BACKGROUND

In collaborating robot environments, such as e.g. production lines, in which robot arms simultaneously perform different process steps, but also in combined human-machine environments, conflicts can occur between different robot arms or between the human and the robot. Therefore, robot arms are equipped with sensors for environmental perception. Pressure methods or tactile methods conventionally used in the sensors are based upon mechanical or pneumatic switches, carbon fibres, conductive silicone rubber, conductive elastomers, piezo-diodes or strain gauges. Technologies which have been increasingly developed and used in recent years are capacitive or resistive touch, surface-acoustics-wave-touch, infrared-touch and projective capacitive-touch. However, it is possible only to a limited extent to operate collaborating robots at high speed by means of these technologies. The reliable approaching, gripping and manipulating of objects with the aid of contactless sensors and contact sensors is also not possible to a satisfactory extent.

Therefore, the object is to provide an improved sensor for environmental perception and/or for reliably gripping and manipulating objects by means of a robot arm.

This object is achieved by the invention stated in the independent claims. Advantageous embodiments are apparent from the dependent claims.

BRIEF DESCRIPTION OF THE INVENTION

In accordance with the invention, a sensor device is provided, comprising at least a first substrate; a capacitive sensor for detecting an approach of an object; a piezoelectric sensor for detecting a pressure or a pressure change; wherein the capacitive sensor is arranged on a first side of the first substrate and the piezoelectric sensor is arranged on a second side of the first substrate, wherein the second side is opposite the first side; or wherein the capacitive sensor and the piezoelectric sensor are arranged on the same side of the substrate.

The arrangement in each case of a piezoelectric sensor (P-sensor) and a capacitive sensor (C-sensor) either on the same side or on opposite sides of the same substrate combines the advantages of the two sensors and provides an integrated sensor device. In particular, with this arrangement it is possible both to detect an approach of an object by means of the capacitive sensor, and to determine a pressure or a holding force by means of the piezoelectric sensor.

The C-sensor, the P-sensor and the substrate can be formed as foils and can be flexible. As a result, e.g. robot-grippers can be equipped over a large surface with the sensor, wherein the sensor can be adapted to rounded support bases.

The C-sensor detects movements, in particular the approach of objects in a region prior to contact, by a change in the capacitance between two electrodes (differential measurement mode) or between an electrode and GND (single-ended measurement mode), or by the combinations of the capacitances between a plurality of electrodes with one another and/or GND and spatial reconstruction of the material distribution (electrical capacitance tomography ECT).

The P-sensor detects forces through the generation of a surface charge proportional to the pressure (polarisation). The integrated sensor detects, e.g. on a robot, the approach by the C-sensor and the force of the contact with the aid of the P-sensor and thus improves the gripping of objects in qualitative terms. The approach information can be used in order to orient e.g. a robot arm in a targeted manner to a better gripping position. The force measurement by means of the P-sensor is used to reliably grip an object (i.e. a robot grips an object with sufficient force so as not to drop it, but at the same time does not grip said object too firmly as to damage it). The C-sensor is always oriented towards the object to be gripped. The P-sensor is concealed by the C-sensor.

The integration of the C-sensor and P-sensor on one substrate, i.e. on an individual foil, increases the flexibility of the integrated sensor device.

The advantage of the piezoelectric force measurement over other methods, such as e.g. a capacitive force measurement, resides in the fact that no elastic materials are required for the sensor structure. Such elastic materials (e.g. "foamed plastics") demonstrate poor dynamic behaviour, hysteresis effects and ageing effects (irreversible deformations, hardening) and as a result have a short service life. By comparison, the piezoelectric force measurement can be achieved in a substantially more stable manner in mechanical terms. In contrast, purely capacitive contact sensors and proximity sensors (e.g. "touch screens") are not able to determine the acting force but instead determine the contacted surface. Moreover, they cannot be used for many materials (e.g. insulating plastics). However, purely piezoelectric sensors cannot register approach procedures. However, the combination of both sensor principles is able to quantitatively detect both the approach and also the contact.

In one embodiment of the invention, the sensor device comprises a second substrate, wherein the capacitive sensor is arranged on the first substrate and wherein the piezoelectric sensor is arranged on the second substrate and wherein the second substrate is laminated onto the first substrate. Therefore, the P-sensor and C-sensor are arranged on different substrates (backplane/frontplane concept). This reduces the risk in terms of the yield because initially two components can be produced and evaluated independently of one another. This allows the selection in each case of high-performance C-sensors and P-sensors in the production process and reduces the waste in the end product.

The first substrate is connected to the second substrate by means of lamination. By means of the lamination, the C-sensor and P-sensor are connected to one another simply and cost-effectively to form the integrated sensor.

In one embodiment of the invention, a base surface of the capacitive sensor substantially matches a base surface of the piezoelectric sensor and/or the capacitive sensor and the piezoelectric sensor form a sensor stack. The sensors are arranged lying one on top of the other either on the same first substrate or on the first or the second substrate and form a sensor stack which comprises a plurality of layers. By reason of the fact that the base surfaces of the C-sensor and the P-sensor match one another, a force can also be detected in each approach region (the region where a detected object comes into contact with the sensor device after the approach). In other words, none of the sensors has a "blind spot" with respect to the other sensor.

In order to laminate the two sensors, it is possible to use a double-sided adhesive foil of ca. 30 μm thickness used in the field of medicine, which can be applied without bubbles by means of suitable carrier foils and a marked but not excessive level of plasticity and which does not substantially co-determine the mechanical properties of the integrated sensor device. The lamination can be effected for precise orientation with a C-sensor which is mounted on a stiffer auxiliary foil and is completely covered by the double-sided adhesive foil. The P-sensor can be rolled and precisely oriented thereon.

In one embodiment of the invention, the sensor device comprises a shield between the capacitive sensor and the piezoelectric sensor. In order to ensure that both the C-sensor and P-sensor can function independently of one another and no interactions occur, the C-sensor is shielded from the P-sensor by means of the shield. The shielding of the C-sensor from the P-sensor requires a shield electrode between a bottom electrode of the C-sensor and a bottom electrode layer of the P-sensor. The buffer layer is thus formed as a shield electrode and is electrically connected to earth.

In one embodiment of the invention, the shield is arranged on a side of the first substrate facing away from the capacitive sensor. In this arrangement, the shield can be applied directly onto the rear side of the first substrate by screen printing. This can be effected in the production process together with the production of the P-sensor on the first substrate. The shield is not part of the P-sensor but can be integrated therein by printing e.g. silver paste (which has a high surface conductivity) onto the rear side of the first substrate. This simplifies production on the whole.

In one embodiment of the invention, the capacitive sensor comprises an electrode layer and a bottom electrode, wherein the electrode layer and the bottom electrode are insulated from one another by means of the first substrate or by means of a first dielectric insulation layer. In those embodiments of the integrated sensor device in which a first substrate and a second substrate are used, the first substrate assumes the function of the first dielectric insulation layer between the electrode layer and the bottom electrode of the C-sensor. As a result, the first dielectric insulation layer does not have to be used. In embodiments in which only the first substrate is provided, the electrode layer must be insulated from the bottom electrode by means of the first dielectric insulation layer in order to ensure the function of the C-sensor.

In one embodiment of the invention, the piezoelectric sensor comprises a bottom electrode layer which is formed preferably from poly(3,4-ethylenedioxythiophene) polystyrene sulfonate (PEDOT:PSS), a ferroelectric copolymer layer (5b) and a top electrode layer. The P-sensor can be produced by means of screen printing, wherein a layer stack is produced by repeated printing procedures. The layer stack which forms the P-sensor comprises the bottom electrode layer. This can be formed from ca. 1 µm thick PEDOT:PSS and is deposited on the first substrate or the second substrate. Then, e.g. a ca. 5 µm thick, pressure-sensitive ferroelectric copolymer layer of PVDF:TrFE (70:30) is formed and once again a 1 µm thick top electrode layer of PEDOT:PSS is formed in the manner of a segmented 4×2 array. After printing, the ferroelectric crystallites (PVDF) in the copolymer (PVDF:TrFE) have no preferred direction. The polarity process orients them in fields of ca. 200 V/µm and thus produces the piezoelectric sensitivity of the layer. The polarity process also permits conclusions to be drawn as to function and sensitivity and thus provides data relating to the yield and the scatter of sensitivity. Therefore, the polarity process functions as a process control in the production of the P-sensors. The 4×2 array is provided in order to be able to recognise the contact point during gripping. The 4×2 array provides an 8 pixel resolution of the contact point. The segmentation (both the number and form) can be changed for the respective application. The same also applies to the form of the capacitive sensor electrodes.

In one embodiment of the invention, the sensor device comprises a lacquer layer for protecting a surface of the sensor device, wherein the lacquer layer is formed on the electrode layer of the capacitive sensor. The lacquer layer protects the sensor device against the effects caused by contact when objects are being gripped and/or handled.

In one embodiment of the invention, the sensor device comprises a second dielectric insulation layer between the shield and the piezoelectric sensor. The second dielectric insulation layer insulates the bottom electrode layer of the P-sensor from the shield which is a conductive layer and is at ambient potential. In embodiments of the invention which comprise a second substrate, the second PET substrate assumes the function of the second dielectric insulation layer.

According to a second aspect of the invention, a method for producing an integrated piezoelectric and capacitive sensor is provided, the method comprising providing a first substrate, arranging a capacitive sensor on a first side of the first substrate, arranging a piezoelectric sensor on a second side of the first substrate, wherein the first side of the substrate is opposite the second side. The method offers an industrially scalable approach for producing large-surface sensors in accordance with the invention in the form of foils.

In one embodiment, the method comprises providing a second substrate. Furthermore, the arranging comprises depositing the capacitive sensor on the first substrate, depositing the piezoelectric sensor on the second substrate and laminating the first substrate onto the second substrate. Both the P-sensor and the C-sensor are deposited either together on the first substrate or individually on a first substrate and a second substrate. The depositing is effected in layers by means of industrially scalable printing methods such that a multilayer foil is produced which forms the sensor. As a result, the sensor can be produced cost-effectively on an industrial scale.

In one embodiment of the method, the laminating is effected by means of a double-sided adhesive foil, wherein the foil has a thickness of ca. 30 µm. In comparison with the embodiments of the invention which use only the first substrate, the lamination offers the advantage of simpler process configuration. The small thickness of the foil does not substantially influence the mechanical properties of the sensor foil. Moreover, in each case two part sensors (P/C) which have a corresponding yield can be connected to one another. This reduces waste of end products.

In one embodiment of the method, the depositing of the capacitive sensor comprises depositing an electrode layer and a bottom electrode, and is effected by means of ink-jet printing. Furthermore, the depositing of the piezoelectric sensor comprises depositing a bottom electrode layer, a ferroelectric copolymer layer and a top electrode layer and is effected by screen printing.

In one embodiment, the method comprises orienting the capacitive sensor in relation to the piezoelectric sensor by orienting the first substrate in relation to the second substrate and/or depositing a shield between the capacitive sensor and the piezoelectric sensor. In order to combine the C-sensor (e.g. on an ECT base) and the P-sensor (e.g. on a PyzoFlex® base), the two sensors are integrated in relation to one another geometrically into one multilayer foil. The geometric integration is effected by orienting geometric features of the C-sensor in relation to geometric features of the P-sensor. In the embodiments in which the P-sensor is applied to a second substrate and the C-sensor is applied to a first substrate, the two substrates are oriented with one another during the lamination. The lamination can be performed for precise orientation with a C-sensor which is mounted on a stiffer auxiliary foil and is completely pasted over by the laminate. The P-sensor can be rolled and very precisely oriented thereon.

In one embodiment of the method, the shield is arranged on a side of the second substrate facing the capacitive sensor, or the shield is formed on a side of the first substrate facing the piezoelectric sensor. The shield is used, as an electrode at ambient potential, for decoupling the electronic processes in the C-sensor and P-sensor. Therefore, the shield is always arranged between the bottom electrode of the C-sensor (ActiveGuard) and the bottom electrode layer of the P-sensor. The signal is applied to the bottom electrode of the C-sensor (ActiveGuard) is the same as the one applied to the electrode layer. This eliminates parasitic capacitances for shielding purposes and reduces interferences from the surrounding area. Instead of the bottom electrode, a further earth electrode can also be provided. This is advantageous in the case of differential measurements. The buffer layer must be insulated in each case from the bottom electrode and the bottom electrode layer. Therefore, insulation layers are to be provided on each side of the shield. Depending upon the embodiment, each one of the insulation layers can be formed by means of the first substrate or the second substrate.

In one embodiment, the method comprises depositing a first dielectric insulation layer between the bottom electrode and the electrode layer of the capacitive sensor and/or depositing a second dielectric insulation layer between the shield and the piezoelectric sensor. The first dielectric insulation layer is part of the C-sensor and, in embodiments comprising only one substrate, insulates the electrode layer thereof from the bottom electrode. In embodiments comprising only one substrate, the second dielectric insulation layer insulates the bottom electrode layer of the P-sensor from the shield. In embodiments comprising a first substrate and a second substrate, the substrates assume the function of the first and second dielectric insulation layers.

According to a further aspect of the invention, a manipulator device comprising at least one manipulator finger is provided, wherein each individual manipulator finger comprises at least one sensor device in accordance with the invention. The invention combines the possibility of locating approaching objects with the possibility of determining tactile information during contact by virtue of the fact that both a proximity sensor (C-sensor) and a contact sensor (P-sensor) are arranged on a foil and cooperate with one another. The foil can be attached extensively on surfaces of robots/machines. The structure of the capacitive C-sensor as a foil makes it possible for the acting force to be transferred to the underlying piezoelectric or (piezoelectric and pyroelectric) P-sensor without substantially adversely affecting said sensor.

According to a further aspect of the invention, a sensor device in accordance with the invention is used for determining an approach of an object to a manipulator device in a collaborative environment. Furthermore, this aspect includes the general use of a sensor device in accordance with the invention for determining an approach. In particular, a signal output by the sensor device can be fragmented into an approach signal and a contact signal. Therefore, the approach of an object to the sensor device and the contacting of the sensor device by the object can be detected separately from one another.

An approach in terms of the present application does not include the contacting of the sensor device or a sensor surface by the approaching object.

According to a further aspect of the invention, a sensor device in accordance with the invention is used for detecting a holding force in a tactile manner during a gripping procedure of a manipulator device.

BRIEF DESCRIPTION OF THE DRAWINGS

Different exemplified embodiments of the invention will be described in greater detail hereinafter. In the drawing:

FIG. 6 shows a schematic overview of signals output by the sensor device.

DESCRIPTION OF THE FIGURES

Figure 1:
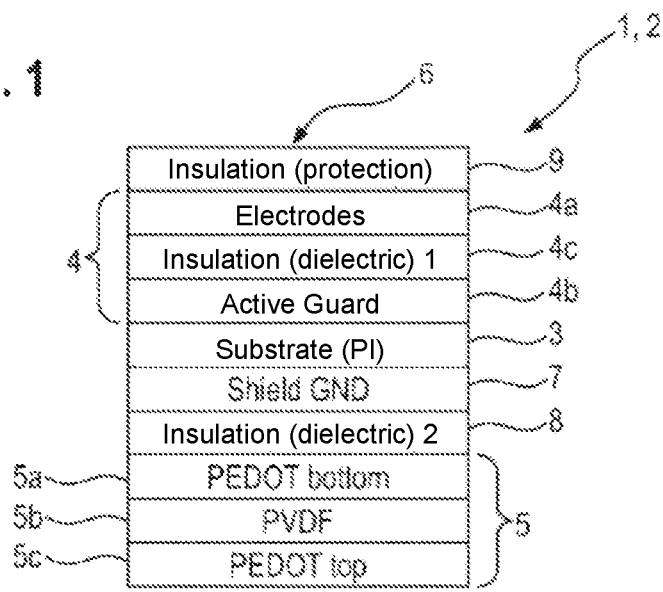
FIG. 1 shows a schematic structure of a first exemplified embodiment of the sensor device in accordance with the invention.

FIG. 1 shows a schematic structure of a first exemplified embodiment of a sensor device 1 in accordance with the invention. The sensor device 1 is formed by means of a layer stack 2. The layer stack 2 comprises a first substrate 3. A capacitive sensor 4 is arranged on a first side (the upper side in the illustration) of the first substrate 3. The capacitive sensor 4 serves to detect an approach of an object to the sensor 1 in a contactless manner.

A piezoelectric sensor 5 is arranged on a second side of the first substrate 3 (the lower side in the illustration). The piezoelectric sensor 5 serves to detect a pressure and thus to determine a holding force which the object exerts on the sensor 1 when it is in contact with a surface of the sensor device 6.

The capacitive sensor 3 is formed by means of an electrode layer 4a and a bottom electrode 4b. Arranged between the electrode layer 4a and the bottom electrode 4b is a first dielectric insulation layer 4c which insulates the electrode layer 4a and the bottom electrode 4b of the capacitive sensor 4 from one another. The electrodes of the electrode layer 4a consist preferably of an ink having a silver proportion.

The piezoelectric sensor 5 is formed by means of three layers. A first layer 5a of the piezoelectric sensor 5 forms a bottom electrode layer. The bottom electrode layer 5a is formed preferably from PEDOT. It has a thickness of ca. 1 µm. A second layer 5b of the piezoelectric sensor 5 is a ferroelectric copolymer layer which is formed preferably from PVDF:TrFE in a ratio of 70:30 mol. % and has a thickness of ca. 5 µm. A third layer 5c of the piezoelectric sensor 5 is a top electrode which consists preferably of PEDOT and has a thickness of ca. 1 µm. A shield (Shield GND) 7 is arranged on the second side of the first substrate 3. The shield 7 serves to electrically shield the capacitive sensor 4 and the piezoelectric sensor 5 from one another. The shield 7 consists preferably of silver paste and is electrically coupled to earth.

The sensor device 1 further comprises a second dielectric insulation layer 8. The second insulation layer 8 is arranged between the first substrate 3 and the piezoelectric sensor 5 and serves to insulate the piezoelectric sensor 5 from the first substrate 3. The shield 7 is arranged between the first substrate 3 and the second dielectric insulation layer 8.

A further insulation layer (protective layer) 9 is arranged on the capacitive sensor 4. It is formed by means of a lacquer and serves to protect the sensor device 1 during the detection of compressive forces resulting from the contact of objects.

Within the layer stack 2, the capacitive sensor 4 and the piezoelectric sensor 5 are oriented with respect to one another. The base surfaces of the capacitive sensor 4 and the piezoelectric sensor 5 correspond substantially to one another. The entire sensor device 1 forms a flexible foil.

Figure 2:
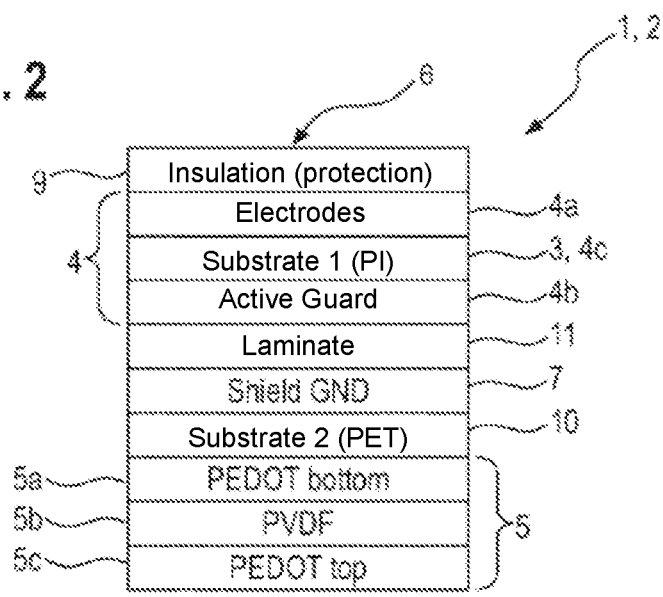
FIG. 2 shows a schematic structure of a second exemplified embodiment of the sensor device in accordance with the invention.

FIG. 2 shows a schematic structure of a second exemplified embodiment of the sensor device 1 in accordance with the invention. In contrast to FIG. 1, the sensor device 1 has an additional second substrate 10. The second substrate 10 is a PET substrate. The capacitive sensor 4 is arranged on the first substrate 3, i.e. the electrode layer 4a is applied to the first substrate 3. The bottom electrode 4b of the capacitive sensor 4 is arranged on a side of the first substrate 3 opposite the electrode layer 4a. The first substrate 3 insulates the electrode layer 4a from the bottom electrode 4b. In this embodiment, it assumes the function of the first dielectric layer 4c. The piezoelectric sensor 5 is arranged on the second substrate 10, i.e. the layers 5a, 5b, 5c are applied to the second substrate 10. The shield 7 is arranged between the first substrate 3 and the second substrate 10. The first substrate 3 is connected to the second substrate 10 by means of a laminate layer 11, wherein the laminate layer 11 is arranged between the bottom electrode 4b and the shield 7. The laminate layer 11 is an adhesive layer.

Figure 3:
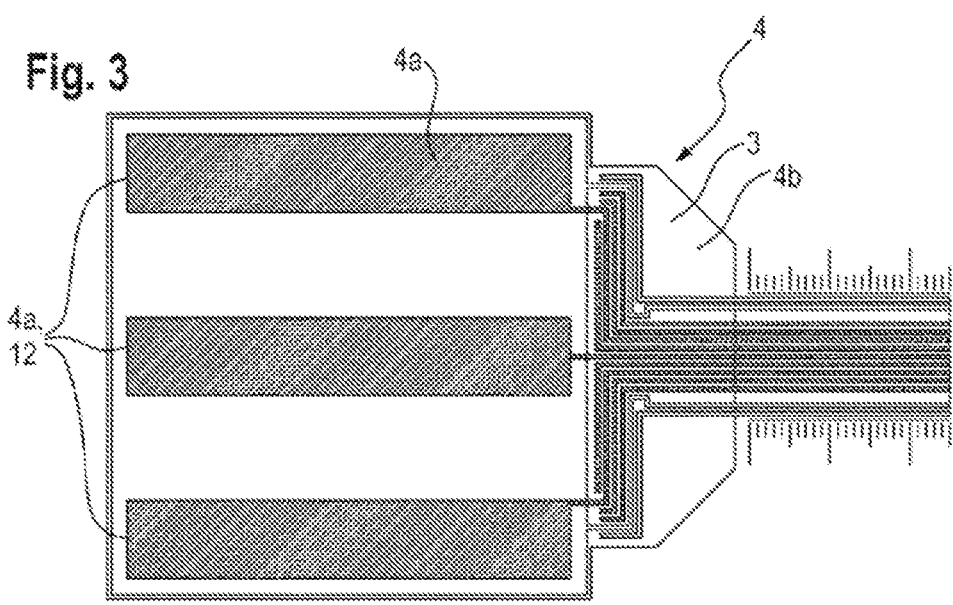
FIG. 3 shows an exemplified embodiment of a capacitive sensor.

FIG. 3 shows an exemplified embodiment of a capacitive sensor 4. The capacitive sensor is designed as a foil and comprises the first substrate 3, to which the electrode layer 4a is applied. The electrode layer consists of three top electrodes and has a first geometric pattern 12. Located underneath the top electrode is a common bottom electrode 4b (also referred to as an active guard layer). The top electrode and the bottom electrode are insulated from one another by means of the first substrate 3.

Figure 4:
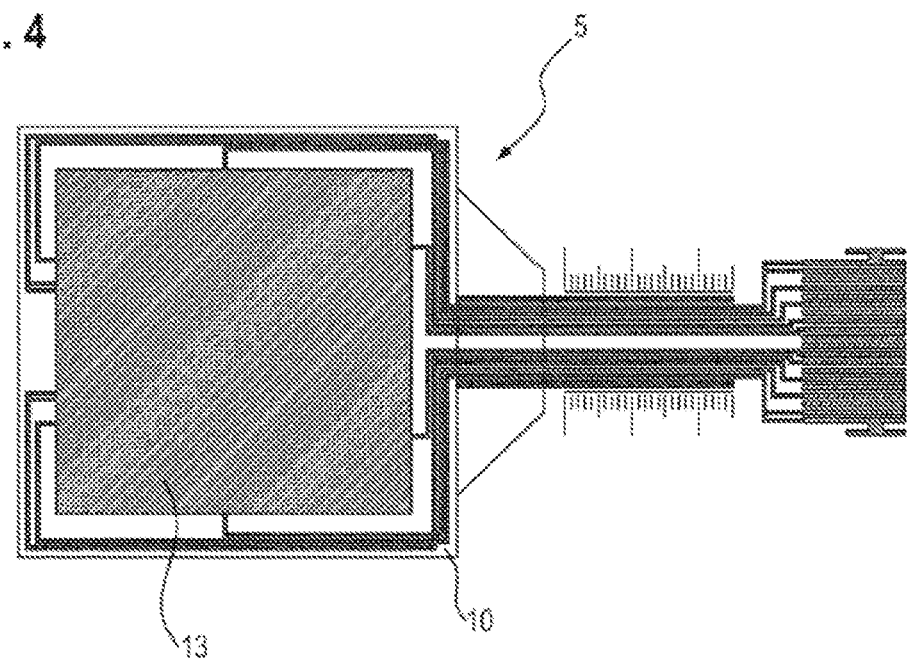
FIG. 4 shows an exemplified embodiment of a piezoelectric sensor.

FIG. 4 shows an exemplified embodiment of a piezoelectric sensor 5. The piezoelectric sensor 5 is designed as a foil and comprises the second substrate 10, to which the layers 5a, 5b, 5c are applied. The first layer 5a of the piezoelectric sensor 5 has a second geometric pattern 13. The first layer 5a of the piezoelectric sensor 5 is segmented and forms a 4×2 array. In the sensor device 1, the geometric patterns 12, 13 of the two sensors 4, 5 are oriented in relation to one another.

Figure 5:
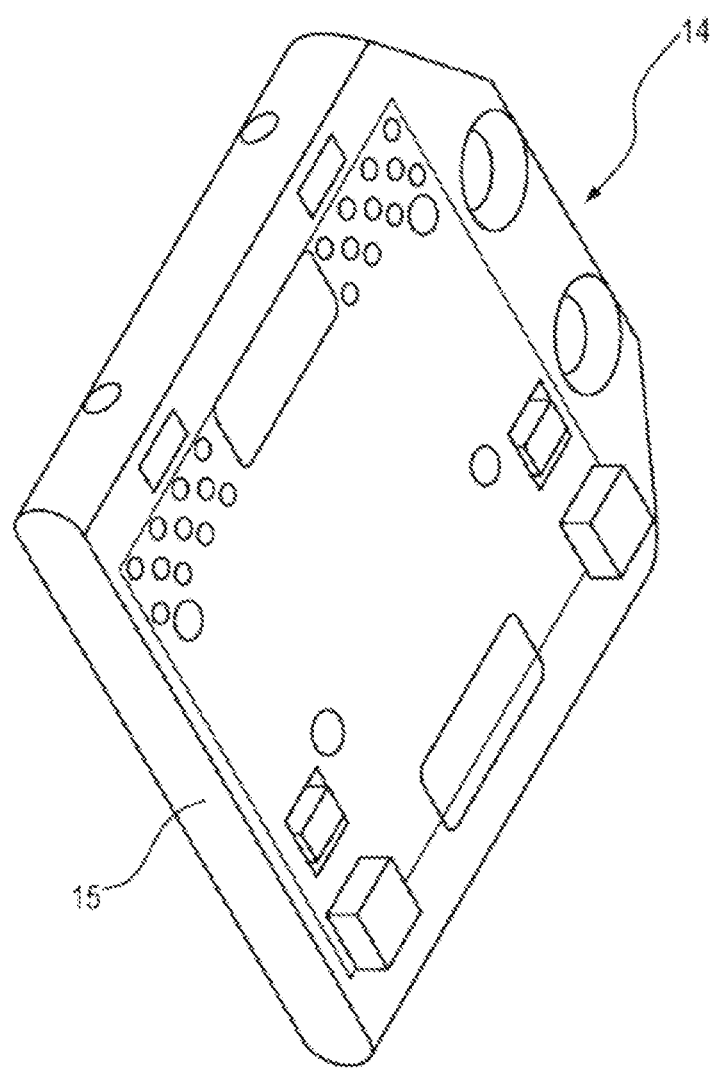
FIG. 5 shows an exemplified embodiment of a robot finger in accordance with the invention.

FIG. 5 shows an exemplified embodiment of a manipulator finger 14 in accordance with the invention. The manipulator finger 14 has a front side and a rear side, wherein the rear side carries a circuit board 15 which serves to control the sensor 1. The sensor device 1 is arranged on the (non-visible) front side of the manipulator finger 14. The front side of the manipulator finger 14 forms the gripping surface of the manipulator and carries the sensor device 1. The manipulator finger 14 has preferably a planar gripping surface of 62 mm×62 mm. In an operational state, the sensor device 1 is arranged on the manipulator limb 14. The sensor is oriented such that the protective layer 9 forms a sensor surface 6 which faces objects to be detected. The approach of an object to the sensor device 1 is detected in a contactless manner by means of the capacitive sensor 4. If an object is to be handled by means of the manipulator limb 14, the piezoelectric sensor 5 determines the forces, which occur between the manipulator limb 14 and object, after contact between the object and the surface of the sensor device 6 is established. By designing the sensors as flexible sensor stack foils, the forces are transmitted mechanically by the capacitive sensor 4 to the piezoelectric sensor 5 and are measured thereby.

FIG. 6 shows a schematic overview of signals output by the sensor device 1 or the fragmentation of an output signal into different signal components. The layer stack 2 which forms the sensor device 1 generates a signal which comprises two signal components. The capacitive sensor 4 generates a first signal component 16 which is interpreted and output as an approach signal by means of a device for approach recognition 17. The device for approach recognition 17 is connected to the sensor stack 2 by means of an electrical connection. The piezoelectric sensor 5 generates a second signal component 18 which is interpreted as a contact signal by means of a device for contact recognition 19. The device for contact recognition 19 is connected to the sensor stack 2 by means of an electrical connection. An approach signal can be a three-dimensional reconstruction of the surrounding space (x, y, z). However, an approach signal can also be interpreted as a sectional image, i.e. as a two-dimensional reconstruction (x, z or y, z) of the surrounding space. Pure distance information (z) can also be output. A limit value for the distance can be established. Below the limit value, a detection signal can be output, or an output of the approach signal can be restricted to cases in which the value is less than the distance limit value. This ensures that undesired detections are reduced.

The invention claimed is:

1. Sensor device (1), comprising:
   a first substrate (3);
   a capacitive sensor (4) for detecting an approach of an object, wherein at least a portion of the capacitive sensor (4) is arranged on a first side of the first substrate (3);
   a piezoelectric sensor (5) for detecting a pressure or a pressure change, wherein the piezoelectric sensor (5) is arranged in the sensor device (1) spaced from a second side of the first substrate (3), the second side of the first substrate (3) being opposite to the first side thereof; and
   a shield electrode (7) between the capacitive sensor (4) and the piezoelectric sensor (5), wherein the shield electrode (7) is electrically coupled to ground.

2. Sensor device (1) as claimed in claim 1, further comprising:
   a second substrate (10);
   wherein the capacitive sensor (4) is arranged on the first substrate (3); and
   wherein the piezoelectric sensor (5) is arranged on the second substrate (10); and
   wherein the second substrate (10) is laminated onto the first substrate (3).

3. Sensor device (1) as claimed in claim 1, wherein a base surface of the capacitive sensor (4) substantially matches a base surface of the piezoelectric sensor (5).

4. Sensor device (1) as claimed in claim 1, wherein the shield electrode (7) is arranged on a second side of the first substrate (3).

5. Sensor device (1) as claimed in claim 1, wherein the capacitive sensor (4) comprises:

an electrode layer (4*a*);

a bottom electrode (4*b*);

wherein the electrode layer (4*a*) and the bottom electrode (4*b*) are insulated from one another by the first substrate (3).

6. Sensor device (1) as claimed in claim 5, wherein the electrode layer (4*a*) is arranged on the first side of the first substrate (3) and the bottom electrode (4*b*) is arranged on the second side of the first substrate (3).

7. Sensor device (1) as claimed in claim 1, wherein the piezoelectric sensor (5) further comprises:

a bottom electrode layer (5*a*);

a ferroelectric copolymer layer (5*b*); and a top electrode layer (5*c*), wherein the ferroelectric copolymer layer (5*b*) is located between the top and bottom electrode layers (5*a*, 5*c*).

8. Sensor device (1) as claimed in claim 7, wherein the bottom electrode layer (5*a*) is formed from poly(3,4-ethylenedioxythiophene) polystyrene sulfonate (PEDOT:PSS).

9. Sensor device (1) as claimed in claim 1, further comprising a lacquer layer (9) for protecting a surface of the sensor device (6).

10. Sensor device (1) as claimed in claim 9, wherein the lacquer layer (9) is formed on the capacitive sensor (4).

11. Sensor device (1) as claimed in claim 1, further comprising:

a dielectric insulation layer (8) between the shield electrode (7) and the piezoelectric sensor (5).

12. A system comprising:

at least one sensor device (1) as claimed in claim 1;

a device for approach recognition (17) for detecting a first signal (16) from the capacitive sensor (4), wherein the first signal (16) is an approach signal; and a device for contact recognition (19) for detecting a second signal (18) from the piezoelectric sensor (5), wherein the second signal (18) is a contact signal.

13. Manipulator device, comprising at least one manipulator finger (14), wherein each individual manipulator finger (14) comprises at least one sensor device (1) as claimed in claim 1 for detecting a holding force in a tactile manner during a gripping procedure of the manipulator device.

14. Sensor device (1) as claimed in claim 1, wherein the capacitive sensor (4) comprises:

an electrode layer (4*a*);

a bottom electrode (4*b*); and a first dielectric insulation layer (4*c*), wherein the electrode layer (4*a*) and the bottom electrode (4*b*) are insulated from one another by the first dielectric insulation layer (4*c*).

15. Sensor device (1) as claimed in claim 14, wherein the capacitive sensor (4) is wholly arranged on the first side of the first substrate (3).

16. Sensor device (1) as claimed in claim 1, wherein the capacitive sensor (4) and the piezoelectric sensor (5) form a stack sensor (2).

\* \* \* \* \*